United States Patent
Zhang et al.

(10) Patent No.: US 9,918,168 B1
(45) Date of Patent: Mar. 13, 2018

(54) MICROPHONE

(71) Applicants: Rui Zhang, Shenzhen (CN); Ting Kang, Shenzhen (CN)

(72) Inventors: Rui Zhang, Shenzhen (CN); Ting Kang, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/417,189

(22) Filed: Jan. 26, 2017

(30) Foreign Application Priority Data

Oct. 25, 2016 (CN) .................... 2016 2 1166452 U

(51) Int. Cl.
| | |
|---|---|
| *H04R 19/04* | (2006.01) |
| *H04R 19/00* | (2006.01) |
| *H04R 1/04* | (2006.01) |
| *B81B 5/00* | (2006.01) |
| *H04R 1/22* | (2006.01) |
| *H04R 1/38* | (2006.01) |

(52) U.S. Cl.
CPC ............... *H04R 19/04* (2013.01); *B81B 5/00* (2013.01); *H04R 1/04* (2013.01); *H04R 1/222* (2013.01); *H04R 1/38* (2013.01); *H04R 19/005* (2013.01); *B81B 2201/0257* (2013.01); *B81B 2203/053* (2013.01); *B81B 2203/06* (2013.01); *H04R 2201/003* (2013.01); *H04R 2499/11* (2013.01)

(58) Field of Classification Search
CPC .......... H04R 1/04; H04R 1/222; H04R 1/342; H04R 1/38; H04R 19/016; H04R 19/04; H04R 25/48; H04R 2201/003; H04R 2499/11; B81B 5/00; H81B 2201/0257
USPC ... 381/91, 92, 122, 123, 313, 355, 356, 357, 381/358, 360, 361, 369, 174, 175; 257/416, 418, 419; 438/51, 53
See application file for complete search history.

(56) References Cited

U.S. PATENT DOCUMENTS

| | | | | |
|---|---|---|---|---|
| 7,233,679 | B2 * | 6/2007 | Muthuswamy | H04R 19/04 381/174 |
| 8,824,719 | B2 * | 9/2014 | Tanaka | H04R 19/04 381/355 |
| 2010/0142743 | A1 * | 6/2010 | Tanaka | H04R 1/04 381/346 |
| 2013/0129133 | A1 * | 5/2013 | Inoda | H04R 19/04 381/337 |

* cited by examiner

*Primary Examiner* — Huyen D Le
(74) *Attorney, Agent, or Firm* — Na Xu

(57) ABSTRACT

A microphone is disclosed. The microphone includes a housing and a circuit board cooperatively forming an accommodation space to accommodate a MEMS chip. The housing forms a first sound channel and the circuit board forms a second sound channel. Further, the microphone includes a controller for controlling the switch of the first and second sound channels.

7 Claims, 3 Drawing Sheets

MICROPHONE

FIELD OF THE PRESENT DISCLOSURE

The present disclosure relates to the field of acoustic-electro transducers, and more particularly to a MEMS microphone.

DESCRIPTION OF RELATED ART

At present, most of existing microphones have only one kind of sound access method, in order to make an electronic equipment have multiple functions, many microphones with only one sound access method are set in this electronic equipment to meet different requirements of the electronic equipment. So that the production cost of the electronic equipment is improved significantly, and more space in the electronic equipment is occupied.

Thereof, it is necessary to disclose and provide an improved microphone to overcome the above-mentioned disadvantage.

BRIEF DESCRIPTION OF THE DRAWING

Many aspects of the exemplary embodiment can be better understood with reference to the following drawing. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
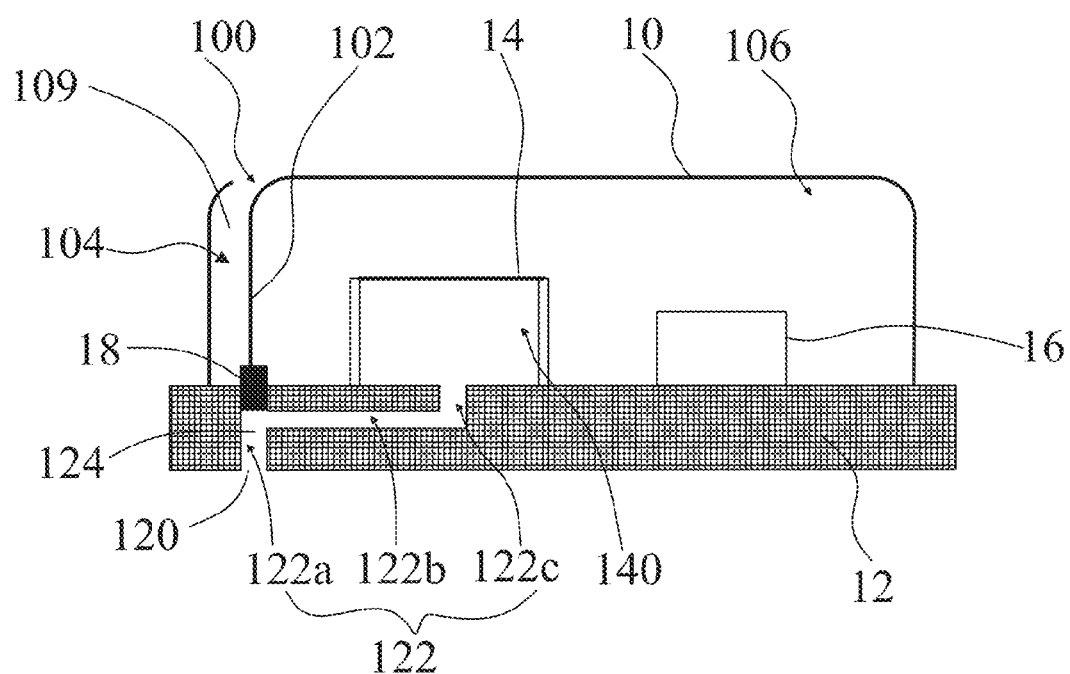
FIG. 1 is an illustrative cross-sectional view of a microphone in accordance with an exemplary embodiment of the present disclosure, at a first state.
Figure 2:
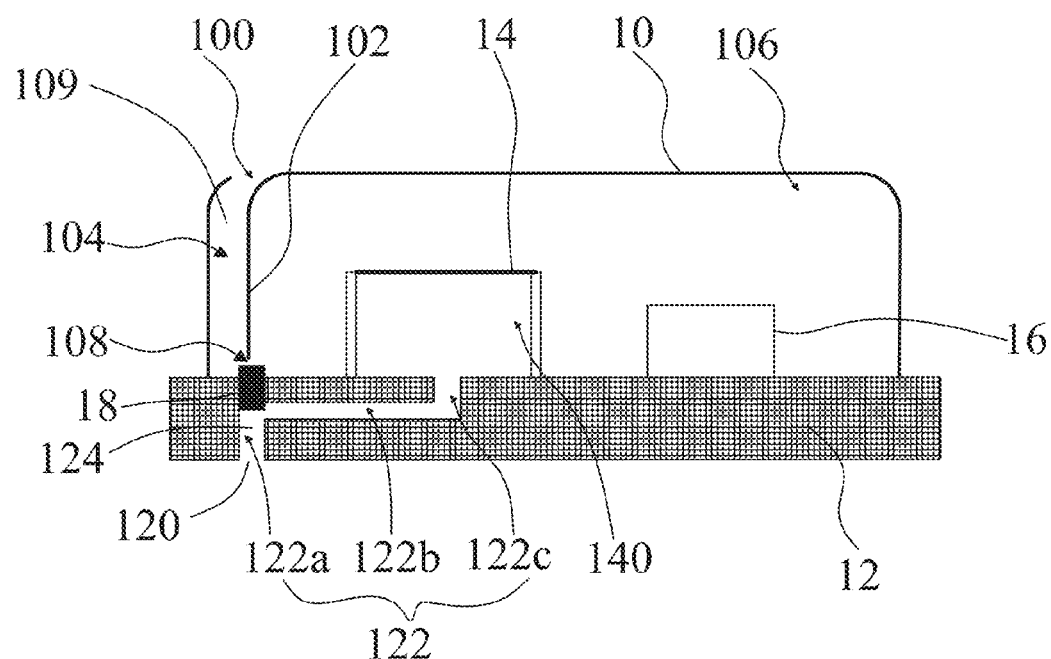
FIG. 2 is an illustrative cross-sectional view of the microphone, at a second state.
Figure 3:
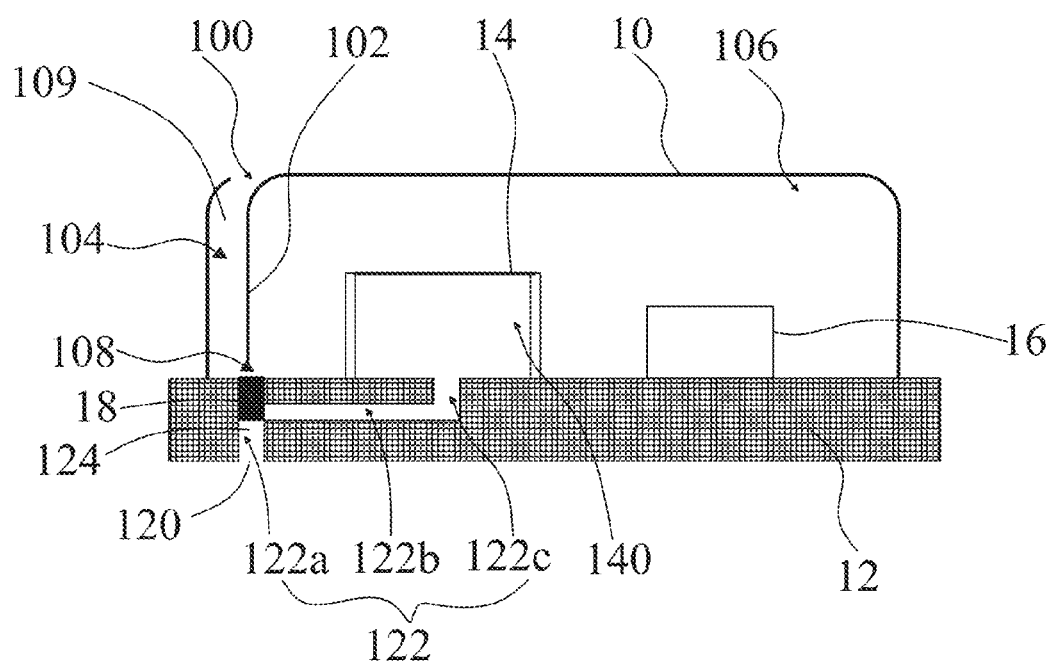
FIG. 3 is an illustrative cross-sectional view of the microphone, at a third state.

As shown in FIGS. 1-3, a microphone comprises a protection shell, a MEMS chip 14, a control circuit chip 16 and a controller 18. A back cavity 140 is formed on the MEMS chip 14.

The protection shell comprises a housing 10 and a circuit board 12. In this embodiment, the circuit board 12 is a printed circuit board (PCB). The housing 10 and the PCB 12 are fixed and connected, in order to form a capsulation cavity, and above MEMS 14 and control circuit chip 16 are set in the capsulation cavity. Specifically, the MEMS chip 14 and the control circuit chip 16 are fixed on the PCB 12. The housing 10 includes an extension part 102 which extends towards the PCB. The extension part 102 divides the capsulation cavity into a sound access cavity 104 and an accommodation cavity 106 which accommodates the control circuit chip 16 and the MEMS chip 14. The housing 10 is provided with a first opening 100 which communicates the external space with the sound access cavity 104 for receiving external sound. A gap 108 is formed between a bottom of the extension part 102 and the PCB 12, which is connected to the sound access cavity 104 and the accommodation cavity 106. The microphone comprises a first sound channel 109 which is connected to the first opening 100 and the accommodation cavity 106. Specifically, the first sound channel 109 passes through the sound access cavity 104 and the gap 108 in turn from the first opening 100, and arrives at the accommodation cavity 106.

The PCB 12 comprises a second opening 120, a second sound channel 122 communicating with the second opening 120 and the back cavity 140 of the MEMS chip 14, and a venthole 124 which penetrates an upper surface and a lower surface of the PCB 12 and is arranged opposite to the extension part 102. The second opening 120 is used for receiving the external sound, and at least part of the venthole 124 is overlapped with the second sound channel 122. In this embodiment, the venthole is a sliding channel where the controller 18 is slidable, in order to control the is switch of the first sound channel and the second sound channel. In other embodiment, one end of the controller can be fixed, and the other end of it can be rotated to switch between the first sound channel and the second sound channel.

The second sound channel 120 comprises a first hole section 122a, a second hole section 122b and a third hole section 122c which are connected in turn, and the first hole section 122a is connected to the external space of a protection shell, and part of the first hole section 122a is overlapped with the venthole 124, and the third hole section 122c is connected to a back cavity 140, and the second hole section 122b is connected to the first hole section 122a and the third hole section 122c. Optionally, the first hole section 122a, the second hole section 122b and the third hole section 122c are linear channels, i.e. the outline surfaces of the first hole section 122a, the second hole section 122b and the third hole section 122c are smooth surfaces, in order to be processed and shaped in a PCB 12 and improve the structure intensity of the PCB 12.

Further, an angle between the second hole section 122b and the first hole section 122a is 90°, and an angle between the second hole section 122b and the third hole section 122c is 90°, so that the shape of the second sound channel 122 is optimized.

As shown in FIG. 1, when the controller 18 slides into the gap 108 and is connected to the bottom of the extension part 102, the controller 18 blocks a first sound channel 109, and the second sound channel 122 is connected to the external space of the protection shell and a back cavity 140 of the MEMS chip 14. The position of the controller 18 in FIG. 1 is a first working position.

As shown in FIG. 2, when the controller 18 slides to the extension part 102 set by interval and the second sound channel 122 is not blocked completely, the first sound channel 109 is connected to the sound access cavity 104 and the accommodation cavity 106, and the second sound channel 122 is connected to the external space of the protection shell and a back cavity 140 of the MEMS chip 14. The position of the controller 18 in FIG. 2 is a second working position.

As shown in FIG. 3, when the controller 18 slides to the extension part 102 set by interval and the second sound channel 122 is blocked completely, the first sound channel 109 is connected to the sound access cavity 104 and the accommodation cavity 106, and the controller 18 blocks the external space of the protection shell and a back cavity 140 of the MEMS chip 14. The position of the controller 18 in FIG. 3 is a third working position.

The controller 18 is an electric or magnetic switch, and its working position can be controlled by an ASIC in the control circuit chip 16 or a PCB 12, in order to realize the function of this utility model.

By virtue of the configuration, the controller 18 is added for a microphone, and the position of the controller 18 in the venthole 124 can be controlled, so that this microphone can make the sound access on the top, at the bottom or both, and allow the microphone itself has multiple functions, which can be applied in different scenarios by different demands of the users, and improve the flexible application of the microphone, in order to reduce the production cost of the electronic equipment, and save the space of the electronic equipment, and improve the working efficiency of the microphone and save the energy consumption.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A microphone comprising:
   a control circuit chip;
   a protection shell including a circuit board and a housing forming a capsulation cavity by engaging with the circuit board, the housing including:
      an extension part extending toward the circuit board for dividing the capsulation cavity into a sound access cavity and an accommodation cavity for accommodating the control circuit chip and the MEMS chip;
      a gap formed between a bottom of the extension part and the circuit board for communicating the sound access cavity with the accommodation cavity; and
      a first opening connecting an external space to the sound access cavity;
   a MEMS chip with a back cavity;
   a first sound channel connecting the first opening and the accommodation cavity, and the first sound channel passing through the sound access cavity and the gap in turn from the first opening and arriving at the accommodation cavity; wherein
   the circuit board comprises a second opening, a second sound channel connecting the second opening and the back cavity of the MEMS chip, a venthole penetrating an upper surface and a lower surface of the PCB, and at least part of the venthole is overlapped with the second sound channel; and wherein
   the microphone further comprises a controller in the venthole for controlling the switch of the first sound channel and the second sound channel.

2. The microphone as described in claim 1, wherein the controller is slidable in the venthole to control the switch of the first sound channel and the second sound channel.

3. The microphone as described in claim 2, wherein when the controller slides into the gap and is connected to the bottom of the extension part, the controller blocks the first sound channel, and the second sound channel is connected to the external space of the protection shell and a back cavity of the MEMS chip.

4. The microphone as described in claim 2, wherein when the controller and the extension part are set by interval and a second sound channel is not blocked completely, the first sound channel is connected to the sound access cavity and the accommodation cavity, and the second sound channel is connected to the external space of the protection shell and a back cavity of the MEMS chip.

5. The microphone as described in claim 2, wherein when the controller and the extension part are set by interval and the second sound channel is blocked completely, the first sound channel is connected to the sound access cavity and the accommodation cavity, and the controller blocks the external space of the protection shell and a back cavity of the MEMS chip.

6. The microphone as described in claim 1, wherein the second sound channel comprises a first hole section, a second hole section and a third hole section connected in turn, and the first hole section and the venthole are overlapped, and connected to the external space of the protection shell, and the third hole section is connected to the back cavity, and the second hole section is connected the first hole section and the third hole section.

7. The microphone as described in claim 1, wherein the controller is an electric or magnetic switch.

* * * * *